United States Patent
Ishiwara

(10) Patent No.: US 6,584,008 B2
(45) Date of Patent: Jun. 24, 2003

(54) FERROELECTRIC NON-VOLATILE MEMORY DEVICE INCLUDING A LAYERED STRUCTURE FORMED ON A SUBSTRATE

(75) Inventor: Hiroshi Ishiwara, Tokyo (JP)

(73) Assignee: Semiconductor Technology Academic Research Center, Tokyo (JP)

( * ) Notice: Subject to any disclaimer, the term of this patent is extended or adjusted under 35 U.S.C. 154(b) by 0 days.

(21) Appl. No.: 09/971,988

(22) Filed: Oct. 4, 2001

(65) Prior Publication Data

US 2002/0012264 A1 Jan. 31, 2002

Related U.S. Application Data

(62) Division of application No. 09/567,865, filed on May 9, 2000, now Pat. No. 6,327,172.

(30) Foreign Application Priority Data

May 19, 1999 (JP) .......................................... 11-138515

(51) Int. Cl.[7] .............................................. G11C 11/22
(52) U.S. Cl. ...................................... 365/145; 257/295
(58) Field of Search ........................... 365/145; 257/295

(56) References Cited

U.S. PATENT DOCUMENTS

| | | | |
|---|---|---|---|
| 5,060,191 A | 10/1991 | Nagasaki et al. | |
| 5,495,438 A | 2/1996 | Omura | |
| 5,523,964 A | 6/1996 | McMillan et al. | |
| 5,856,688 A | 1/1999 | Lee et al. | |
| 6,046,929 A | 4/2000 | Aoki et al. | |
| 6,094,369 A | 7/2000 | Ozawa et al. | |
| 6,154,387 A | 11/2000 | Takata | |

FOREIGN PATENT DOCUMENTS

| | | |
|---|---|---|
| EP | 0 720 172 A2 | 7/1996 |
| EP | 0 720 172 A3 | 6/1998 |
| JP | 04 171978 | 10/1992 |
| JP | 11-17123 | 1/1999 |
| JP | 110171123 A | 1/1999 |
| WO | WO 95/26570 | 10/1995 |

OTHER PUBLICATIONS

Office Action mailed Feb. 5, 2002 for Japanese Patent Application No. 138515, with one reference, Japanese Patent No. 11–17123 (previously cited and also enclosed as reference F6).

English–language translation of Office Action cited above.

Isiwara, Hiroshi, "Proposal of a Novel Ferroelectric–Gate Field Effect Transistor with Separated Functions for Data Read–Out and Data Storage," *Precision and Intelligence Laboratory, Tokyo Institute of Technology*, Sep. 1991, pp. 222–223.

Ishiwara, Hiroshi, "Current Status and Prospects of Digital and Analog Memories Using MFSFETs," *Journal of Korean Physical Society*, 32:S1325–S1328, Feb. 1998.

Ishiwara, Hiroshi et al., Proposal of a Single–Transistor––Cell–Type Ferroelectric Memory Using an SOI Structure and Experimental Study on the Interference Problem in the Write Operation, *Jpn. J. Appl. Phys.*, 36:1655–1656, Mar. 1997.

*Primary Examiner*—Hoai Ho
(74) *Attorney, Agent, or Firm*—Christensen O'Connor Johnson Kindness PLLC

(57) ABSTRACT

A ferroelectric non-volatile memory device comprising a MOS cell transistor, two ferroelectric capacitors each of which has one terminal connected to the gate electrode of the cell transistor and has almost the same remanent polarization, and a selector transistor connected to the other terminal of one ferroelectric capacitor, wherein data is stored by polarizing the ferroelectric thin films of the capacitors in opposite directions with respect to the gate electrode of the cell transistor.

9 Claims, 4 Drawing Sheets

FERROELECTRIC NON-VOLATILE MEMORY DEVICE INCLUDING A LAYERED STRUCTURE FORMED ON A SUBSTRATE

CROSS-REFERENCE TO RELATED APPLICATIONS

This application is a divisional application of U.S. patent application Ser. No. 09/567,865, filed on May 9, 2000 now U.S. Pat. No. 6,327,172, and claims the benefit of priority from Japanese Patent Application No. 11-138515, filed on May 19, 1999, and incorporates the content of both applications in their entirety herein by reference.

FIELD OF THE INVENTION

The present invention relates to a ferroelectric non-volatile memory device and, more particularly, to a ferroelectric non-volatile memory device having a ferroelectric capacitor connected to the gate of a MOS (Metal Oxide Semiconductor) or MIS (Metal Insulator Semiconductor) field effect transistor.

BACKGROUND OF THE INVENTION

The formation of a junction between a semiconductor and a ferroelectric can create, depending on the polarization direction of the ferroelectric, a state in which electrons are induced to the semiconductor surface, or a state in which holes are induced. Attempts have already been made to manufacture non-volatile memory devices which hold memory contents even after power-off operation by using a ferroelectric for the gate insulator film of a MOS field effect transistor and making the two states correspond to "0" and "1". However, no practical devices have been realized yet. Devices with this structure are difficult to manufacture for the following reason. If a semiconductor and ferroelectric are joined to each other, an interface state is formed to capture electrons and holes. This stops the flow of a necessary current through the source-drain path of a field effect transistor.

To solve this problem, an MFIS (M: Metal or Conductor, F: Ferroelectric, I: Insulator, S: Semiconductor) structure and an MFMIS structure are proposed. In the MFIS structure, a dielectric (paraelectric) film such as a silicon dioxide ($SiO_2$) film that hardly forms any interface state with a semiconductor is inserted between a ferroelectric film and a semiconductor substrate. In the MFMIS structure, a conductive layer is further sandwiched between a ferroelectric film and a dielectric film. However, if the series structure of ferroelectric and dielectric films is used as the gate insulator film of the field effect transistor, new problems arise: (1) the data write-in voltage rises, and (2) the data retention time is shortened. These problems will be explained.

The rise in the write-in voltage will be explained by exemplifying a structure. In this case, the semiconductor substrate is made of Si, the ferroelectric film is made of lead zirconate titanate (PZT: $PbZr_{1-x}Ti_xO_3$), and the dielectric film is made of $SiO_2$. The MFIS structure may be adopted as the structure of the gate electrode, but the MFMIS structure is adopted for these materials in order to prevent mutual diffusion of Pb atoms in the PZT film and Si atoms in the $SiO_2$ film. The relative dielectric constant of $SiO_2$ is 3.9. The relative dielectric constant of PZT takes a value ranging from 200 to 600 depending on the composition ratio of Zr and Ti, and is assumed to be 390 for descriptive convenience. In general, the thickness of the $SiO_2$ film is 1/10 that of the PZT film.

Since the capacitance of the capacitor is proportional to the relative dielectric constant and inversely proportional to the film, the ferroelectric capacitor and the dielectric capacitor have a capacitance ratio of 10:1. When two capacitors are series-connected, and a voltage is applied to them, the voltage applied to each capacitor is inversely proportional to the capacitance of the capacitor. The voltage applied to the ferroelectric capacitor is 1/10 that to the dielectric capacitor, i.e., 1/11 the total voltage. Assume that an MFS structure in which the PZT film is directly deposited on the Si substrate is formed, and the polarization of the film can be inverted at 5V. An MFMIS structure formed at the same film thickness requires a high voltage of 55V for polarization inversion.

The short data retention time will be explained with reference to FIGS. 9A and 9B. The equivalent circuit of the MFMIS structure is shown in FIG. 9A. In FIG. 9A, reference symbol $C_F$ denotes a ferroelectric capacitor; $C_I$, a dielectric capacitor. In this case, the whole semiconductor is kept at the ground potential without considering the capacitance of the depletion layer of the semiconductor.

If a voltage V is applied to an upper electrode, voltages $V_F$ and $V_I$ are applied to the two capacitors. The voltages $V_F$ and $V_I$ satisfy $$V_F + V_I = V \tag{1}$$

Let ±Q be the amount of electric charges appearing in the upper and lower electrodes of the ferroelectric capacitor. As shown in FIG. 9A, the amount ±Q of electric charges also appears in the upper and lower electrodes of the dielectric capacitor on a condition that the net electric charges of an intermediate portion between the two capacitors must be 0. Since the dielectric capacitor has the relation of $Q = C_I V_I$, a substitution of this relation into equation (1) yields:

$$Q = C_I (V - V_F) \tag{2}$$

The relationship between Q and $V_F$ of the ferroelectric capacitor exhibits hysteresis, as shown in FIG. 9B. This relation given by equation (2) is overlapped in FIG. 9B to obtain a straight line in FIG. 9B. An intersection between the lines represents a voltage applied to the ferroelectric and the amount of electric charges appearing in the capacitor electrode. A point A in FIG. 9B represents Q and $V_F$ when the voltage is kept at V after a large voltage is positively applied, and a point B represents Q and $V_F$ when the voltage is kept at V after a large voltage is negatively applied.

If the voltage is reset to 0 after a large voltage is positively applied, Q and $V_F$ of the ferroelectric capacitor change to a point C in FIG. 9B, and the polarization direction and electric field direction are opposite. In other words, if the gate voltage is reset to 0 to hold data after data is written by applying a positive voltage to the gate electrode of a field effect transistor having the MFIS or MFMIS gate structure, an electric field opposite to the polarization direction is applied to the ferroelectric, and the remanent polarization disappears within a short time. Particularly when the capacitance of the series-inserted dielectric capacitor is small, the magnitude of an inverse electric field comes close to the coercive electric field (electric field necessary for resetting the polarization to 0) of the ferroelectric, and the polarization retention time becomes very short.

The short retention time may not be ignored not only in the MFIS and MFMIS structures but also in the MFS structure. Even if an interface with low trapping state density can be formed between a ferroelectric film and a semiconductor film, and a field effect transistor having a fine MFS gate structure can be manufactured, the ferroelectric capacitor and the capacitance of a depletion layer formed in the semiconductor surface form a series capacitor to pose almost the same problem as shown in FIG. 9B.

For this reason, a conventional non-volatile memory device using a ferroelectric for the gate insulator film of a MOS field effect transistor must adopt the MFIS or MFMIS structure so as not to form an interface state between a semiconductor substrate and the ferroelectric film. However, this type of structure increases the data write-in voltage and shortens the data retention time.

SUMMARY OF THE INVENTION

It is an object of the present invention to provide a ferroelectric non-volatile memory device capable of decreasing the data write-in voltage and prolonging the data retention time in a memory cell structure using a ferroelectric capacitor.

According to the present invention, there is provided a ferroelectric non-volatile memory device comprising a MOS or MIS cell transistor, and two ferroelectric capacitors which are connected to a gate electrode of the transistor and have substantially the same remanent polarization, wherein data is stored by polarizing ferroelectric thin films of the capacitors in opposite directions with respect to the gate electrode of the transistor, and a selector transistor is formed on one side of one capacitor.

According to the present invention, there is provided a ferroelectric non-volatile memory device comprising a MOS or MIS cell transistor, two ferroelectric capacitors each of which has one terminal connected to a gate electrode of the cell transistor and has substantially the same remanent polarization, and a selector transistor connected to the other terminal of one of the ferroelectric capacitors, wherein data is stored by polarizing ferroelectric thin films of the capacitors in opposite directions with respect to the gate electrode of the cell transistor.

Preferable aspects of the present invention include the following arrangements:

(1) One of the capacitors has one terminal connected to the gate electrode of the cell transistor and the other terminal connected to a bit line via the selector transistor, the other capacitor has one terminal connected to the gate electrode of the cell transistor and the other terminal connected to a plate line, and the gate electrode of the selector transistor is connected to a word line.

(2) In arrangement (1), the source of the cell transistor is grounded, and its drain is connected to the word line.

(3) In arrangement (1), the source of the cell transistor is grounded, and its drain is connected to the bit line.

According to the present invention, a memory cell structure is formed by connecting two ferroelectric capacitors having almost the same remanent polarization to the gate electrode of a MOS or MIS cell transistor. Data is stored in accordance with the polarization direction and remanent polarization of the ferroelectric thin film. In storing data, the ferroelectric thin films of the capacitors are polarized in opposite directions with respect to the gate electrode of the cell transistor. Electric charges generated upon polarization of the ferroelectric thin film are not induced to the semiconductor surface of the channel region of the cell transistor.

In this case, since the voltage is directly applied to the ferroelectric thin film, the data write-in voltage can be decreased. Since the internal electric fields of the two ferroelectric capacitors are 0 regardless of whether data is held in a "0" or "1" state, the data retention time can be prolonged. That is, in a memory cell structure using the ferroelectric capacitors, the data write-in voltage can be decreased, and the data retention time can be prolonged.

In addition, since the selector transistor is connected to a side of one ferroelectric capacitor opposite to the cell transistor, an unselected cell can be prevented from being influenced by the write-in voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

There will now be described a ferroelectric non-volatile memory device referring to FIGS. 1A and 1B.

Figure 1A:
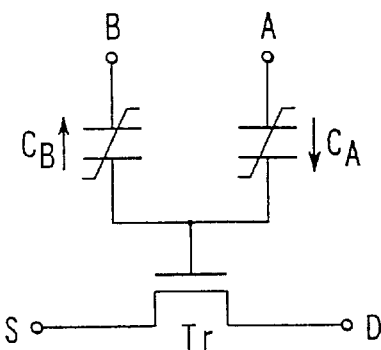
FIGS. 1A and 1B are equivalent circuit diagrams, respectively, showing the memory cell structure of a ferroelectric non-volatile memory device.
Figure 1B:
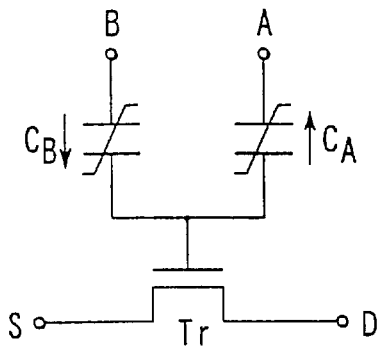

In an equivalent circuit representing the memory cell structure of a ferroelectric non-volatile memory device shown in FIGS. 1A and 1B, one terminal of each of two ferroelectric capacitors $C_A$ and $C_B$ having the same remanent polarization is connected to the gate of a cell transistor (MOSFET) Tr having a MOS structure. The other terminal of the capacitor $C_A$ is connected to a terminal A, whereas the other terminal of the capacitor $C_B$ is connected to a terminal B. The transistor Tr and the capacitors $C_A$ and $C_B$ constitute one memory cell. The ferroelectric films of the capacitors $C_A$ and $C_B$ are made of PZT, and have the same area and film thickness.

The memory cell of this structure can also be used for an analog memory device. However, for descriptive convenience, the operation will be described by exemplifying a case in which the memory cell is used for a digital memory device. Although not shown, memory cells are arranged in a matrix to form a memory array.

To write data "0" or "1" in the memory cell of this structure, the terminal B is grounded, and a positive or negative voltage is applied to the terminal A. When the influence of the potential on the semiconductor side cannot be ignored owing to a large gate capacitance of the transistor Tr, ½ the voltage applied to the terminal A is applied to set the potential of the semiconductor to a floating state or an intermediate potential between two series-connected ferroelectric capacitors.

In this description, "1" is a state in which a positive voltage is applied to the terminal A to make the polarization direction of the ferroelectric capacitor $C_A$ downward and the polarization direction of the ferroelectric capacitor $C_B$ upward, as shown in FIG. 1A. "0" is a state in which a negative voltage is applied to the terminal A to make the polarization direction of the ferroelectric capacitor $C_A$ upward and the polarization direction of the ferroelectric capacitor $C_B$ downward, as shown in FIG. 1B.

When the voltage of the terminal A is reset to 0 after "0" or "1" is written, no electric charges are induced to the gate electrode of the transistor Tr and the semiconductor surface of the channel region because the two ferroelectric capacitors $C_A$ and $C_B$ have the same remanent polarization. Accordingly, $V_G$ is kept to 0V from the relation of $Q_G = C_G V_G$ ($Q_G$: the electric charges of the gate electrode, $C_G$: gate capacitance, $V_G$: gate potential). Hence, the internal electric fields of the two ferroelectric capacitors $C_A$ and $C_B$ are 0 regardless of whether data is held in a "0" or "1" state. The data retention time is expected to be as long as that of a general one-transistor/one-capacitor ferroelectric memory cell having a structure similar to the DRAM. Since the voltage is directly applied to the ferroelectric capacitor, the write-in voltage is expected to be low even with a high relative dielectric constant of the ferroelectric thin film.

To read data written in the memory cell, the terminal A is opened, the semiconductor substrate is grounded, and a positive voltage is applied to the terminal B. In this case, when written data is "1", as shown in FIG. 1A, the polarization amount of the ferroelectric capacitor $C_B$ greatly changes, and the electric charges $Q_G$ of the gate electrode change from 0. Letting P be the polarization amount of the ferroelectric thin film upon application of a positive voltage, $Q_G = (P_r + P)S$ (S: the area of the ferroelectric capacitor, $P_r$: the remanent polarization of the ferroelectric film). $P = -P_r$ holds before application of a positive voltage, and changes to $P = P_S$ ($P_S$: saturated polarization) after application of a sufficiently large positive voltage. Then, electric charges $-Q_G$ are generated near the semiconductor surface. By properly selecting the threshold voltage of the transistor Tr, the source-drain path flows a current by inversion electrons.

When written data is "0", no polarization reversal of the ferroelectric thin film occurs. Even for a sufficiently large positive application voltage, only $(P_S - P_r)S$ electric charges $Q_G$ are generated in the gate electrode. Since the difference between $P_S$ and $P_r$ is generally small, almost no negative electric charges are induced to the semiconductor surface. In this case, the source-drain path of the transistor Tr does not flow any current.

Thus, data can be read by applying a pulse voltage to the terminal B and measuring the drain current of the MOSFET at this time. In read, the voltage is applied through the gate insulator film of the MOSFET, and the read-out voltage may rise. However, this read-out voltage need not be applied until $P = P_S$ holds for written data "1". Even a voltage enough to set $P = 0$ is applied to establish $Q_G = P_r S$, and satisfactory read operation can be achieved.

After read, both the terminals A and B are reset to 0V. For written data "0", $Q_G = 0$ holds, and the state returns to one before read. For written data "1", the polarization does not perfectly return to the original one when the read-out voltage is reset to 0. For this reason, data "1" is rewritten based on read-out data at a proper frequency.

In this structure, the terminal B is grounded, a positive or negative voltage is applied to the terminal A, and the ferroelectric thin films of the ferroelectric capacitors $C_A$ and $C_B$ are polarized in opposite directions with respect to the gate electrode. Data can be stored in accordance with the polarization direction and remanent polarization of the ferroelectric thin film without inducing electric charges generated upon polarization of the ferroelectric thin film to the channel region. Since the internal electric fields of the two ferroelectric capacitors $C_A$ and $C_B$ are 0 regardless of whether data is held in a "0" or "1" state, the data retention time can be prolonged. Since the voltage is directly applied to the ferroelectric thin film, the data write-in voltage can be decreased.

Figure 2A:
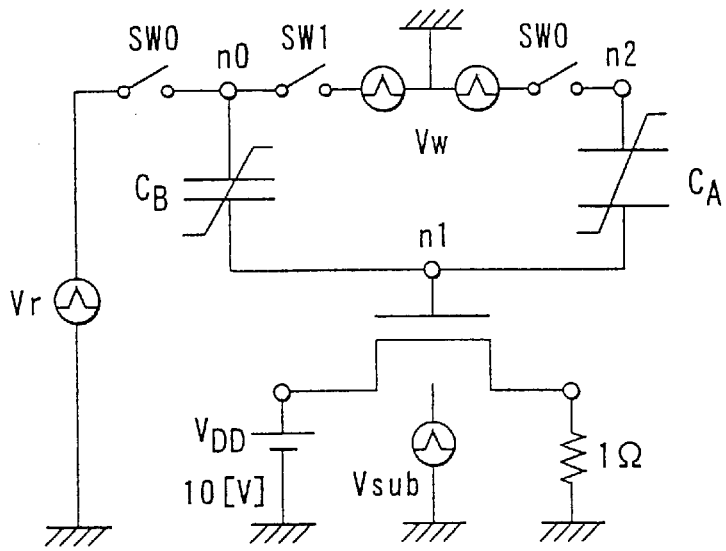
FIG. 2A is a circuit diagram showing a circuit arrangement of a memory operation analyzer using a MOSFET.
Figure 2B:
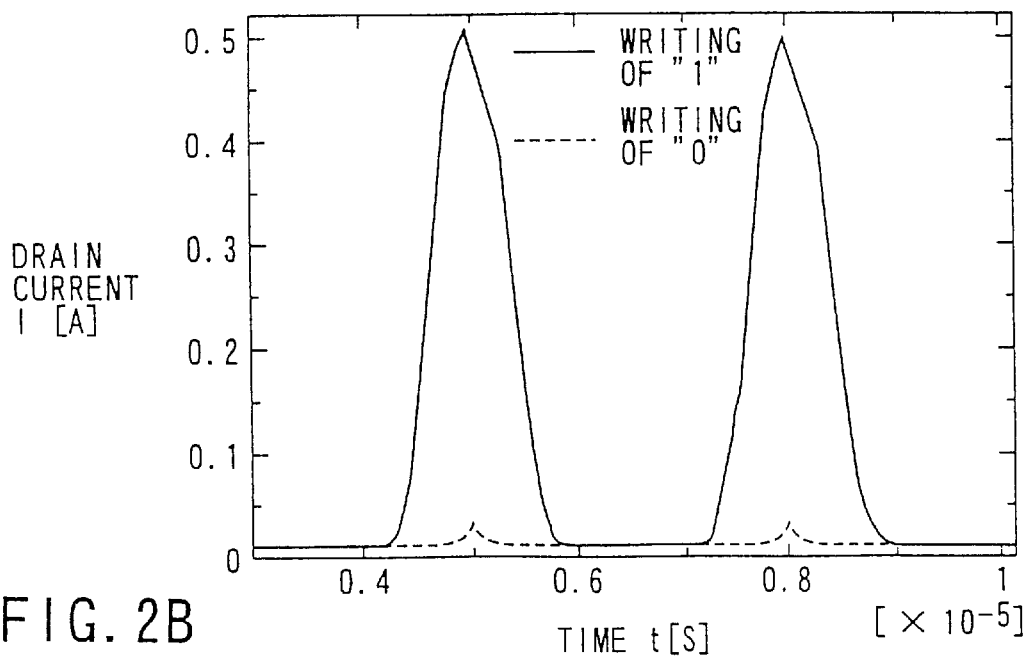
FIG. 2B is a graph showing a change in drain current upon application of a read-out voltage.

The results of analyzing the characteristics of a transistor with this structure using a circuit simulator SPICE will be described. FIG. 2A shows a circuit used for operation analysis, and FIG. 2B shows a change in drain current upon application of a read-out pulse.

While switches SW0, SW1, and SW2 are OFF, ON, and OFF, respectively, a positive or negative voltage is applied to a terminal n2 to store data "0" or "1". The switches SW0, SW1, and SW2 are respectively turned off, on, and on, thereby holding the memory state. The switches SW0, SW1, and SW2 are respectively turned on, off, and off, and a voltage is applied to a terminal n0 to read out data. From FIGS. 2A and 2B, data "0" or "1" can be easily read out by measuring the drain current.

An embodiment of the present invention will be described in detail with reference to the several views of the accompanying drawing.

This embodiment adds, to the structure of FIGS. 1A and 1B, a selector transistor comprised of a MOSFET so as not to influence an unselected cell by the write-in voltage.

The MOSFET serving as a switch for selective write operation is connected to the portion (FIG. 3A) of the terminal A (or terminal B) in FIGS. 1A and 1B, or at a portion (FIG. 3B) between the gate and one capacitor. In other words, in the structure shown in FIG. 3A, the gate of a cell transistor Q1 is connected to the node of the capacitors $C_A$ and $C_B$ connected in series to each other. A selector transistor Q2 is connected between a capacitor $C_B$ and a terminal b. The terminals a, b and c are connected to a driver DR. In the structure shown in FIG. 3B, a selector transistor Q2 is between the gate of the cell transistor $Q_1$ and the capacitor $C_B$.

Figure 3A:
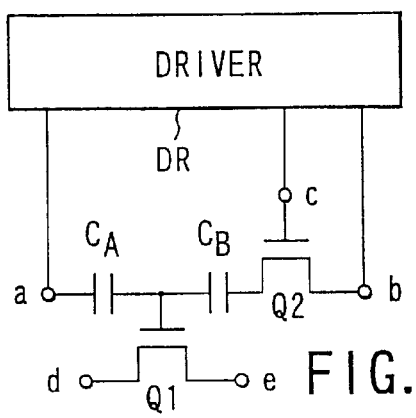
FIGS. 3A and 3B are equivalent circuit diagrams each showing the memory cell structure of the ferroelectric non-volatile memory device according to the embodiment of the present invention.
Figure 3B:
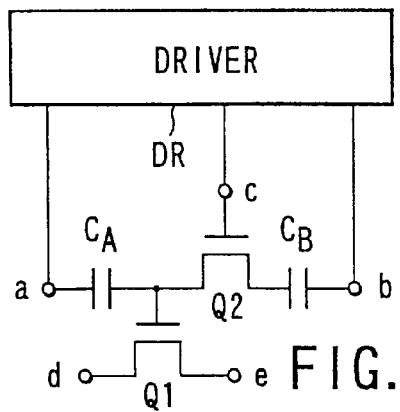

Regardless of whether the selector transistor is connected to either of the two positions shown in FIGS. 3A and 3B, the same effects can be obtained as far as the selector transistor is kept off when the cell is not selected. In terms of the manufacture, the structure of FIG. 3A is superior because two capacitors can be directly formed on the floating gate electrode of the cell transistor. This embodiment will examine an arrangement in which the structure of FIG. 3A is processed as a unit cell.

Figure 4A:
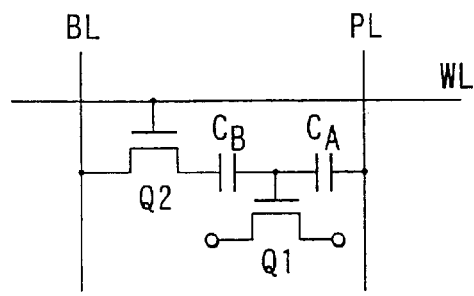
FIGS. 4A and 4B are circuit diagrams each showing a state in which the memory cell of FIGS. 3A or 3B is connected to a bit line BL, word line WL, and plate line PL.
Figure 4B:
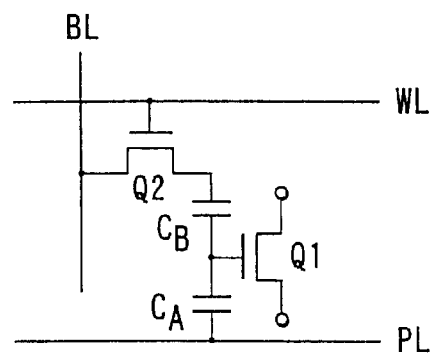

According to the structure shown in FIG. 3A, in write, a voltage applied to the terminal c turns on/off the selector transistor Q2 to control whether a voltage appearing between the terminals a and b is actually applied to the ferroelectric capacitors $C_A$ and $C_B$. Accordingly, voltages at the terminals a, b, and c must be independently controlled from a peripheral circuit. Constituting this memory cell array requires at least three control lines a', b', and c'. If the lines b' and c' are parallel to each other, cells connected to them similarly operate, and do not play the role as a selector switch. Hence, the lines b' and c' must cross each other, and the three lines are arranged as shown in FIGS. 4A or 4B. According to convention, the lines a', b', and c' will be referred to as a plate line (PL), bit line (BL), and word line (WL).

In FIG. 4A, one terminal of the capacitor $C_A$ is connected to the gate electrode of the cell transistor Q1, and the other terminal is connected to the plate line PL. One terminal of the capacitor $C_B$ is connected to the gate electrode of the cell transistor Q1, and the other terminal is connected to the bit line BL via the selector transistor Q2. The gate electrode of the selector transistor Q2 is connected to the word line WL. In FIG. 4B, the connection is the same except that the plate line PL is parallel to the word line WL.

Read operation will be explained. In read, the terminal of one capacitor is opened, the polarization of the other capacitor is reversed, and a current flowing through the d–e path at this time is detected. A new current detection line may be arranged, which is not preferable for a high cell arrangement density. Thus, the terminal d is connected to one of the word line WL, bit line BL, and plate line PL, and the terminal e is grounded. A case in which no common ground point exists, like an SOI (Si film on an insulator) substrate, will also be considered at last.

When the polarization is reversed via the plate line PL without the mediacy of the selector transistor Q2 for cell selection, the line connected to the terminal d must cross the plate line PL. On the other hand, when the polarization is reversed via the bit line BL, the plate line PL must be open, and thus the terminal d cannot be connected to the plate line PL. Therefore, available connection methods are limited to four methods shown in FIGS. 5A to 5D.

Figure 5A:
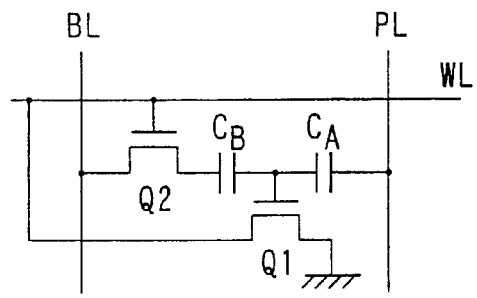
FIGS. 5A to 5D are circuit diagrams each showing a state in which a cell transistor is connected to lines in the cell structure of FIGS. 4A or 4B.
Figure 5B:
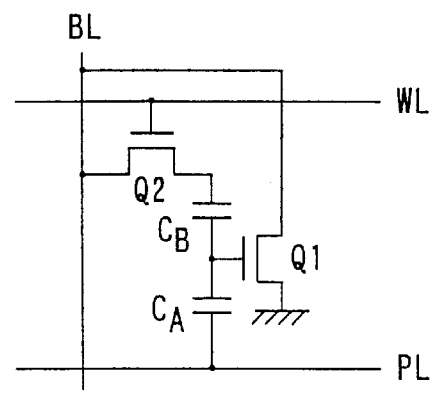
Figure 5C:
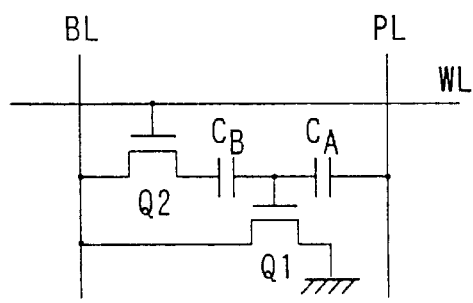
Figure 5D:
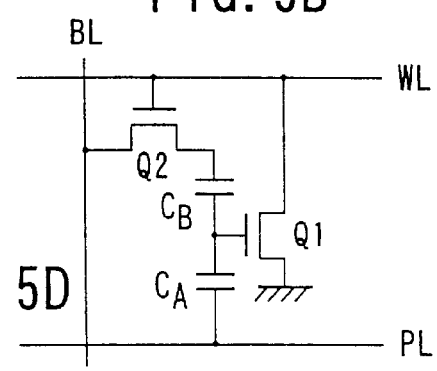

In FIG. 5A, in addition to the structure of FIG. 4A, the source of the cell transistor Q1 is grounded, and its drain is connected to the word line WL. In FIG. 5B, in addition to the structure of FIG. 4B, the source of the cell transistor Q1 is grounded, and its drain is connected to the bit line BL. In FIG. 5C, in addition to the structure of FIG. 4A, the source of the cell transistor Q1 is grounded, and its drain is connected to the bit line BL. In FIG. 5D, in addition to the structure of FIG. 4B, the source of the cell transistor Q1 is grounded, and its drain is connected to the word line WL.

Figure 6:
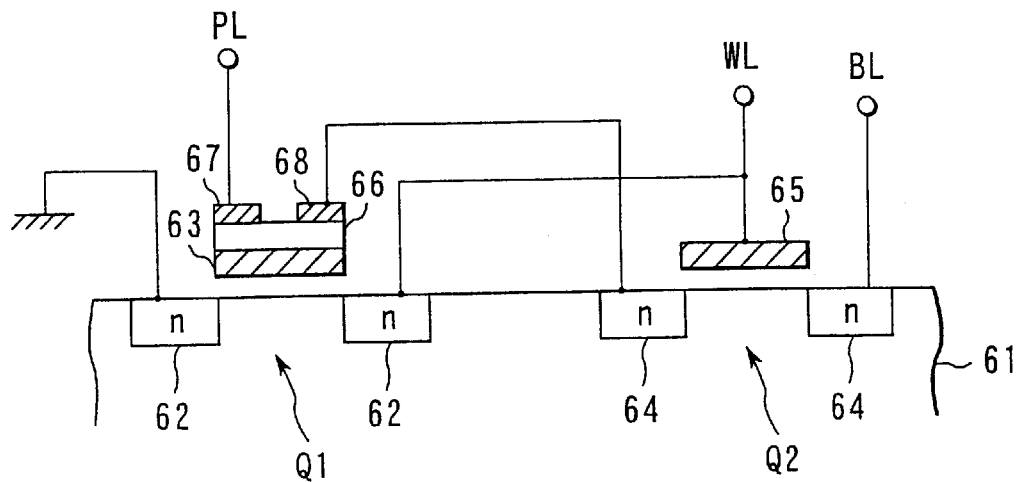
FIG. 6 is a sectional view showing an element structure for realizing the circuit arrangement shown in FIG. 5D.

A structure in which the source of the cell transistor Q1 is grounded, and its drain is connected to the word line WL, like the connection of FIG. 5D, is shown in the sectional view of a device structure in FIG. 6. An n-channel MOS transistor (cell transistor) Q1 made up of n-type diffusion regions 62 and a gate electrode 63, and an n-channel MOS transistor (selector transistor) Q2 made up of n-type diffusion regions 64 and a gate electrode 65 are formed on a p-type Si substrate 61 so as to be adjacent to each other. Capacitor electrodes 67 and 68 are formed on the gate electrode 63 of the cell transistor Q1 via a ferroelectric film 66 and formed of ferroelectric thin films, thereby constituting the two ferroelectric capacitors $C_A$ and $C_B$.

If no common ground point exists, like an SOI substrate, a line grounded in read can be used. Connection methods in this case are shown in FIGS. 7A to 7D. In FIGS. 7A to 7D, some of the methods use the line of an adjacent cell in consideration of an actual arrangement.

Figure 7A:
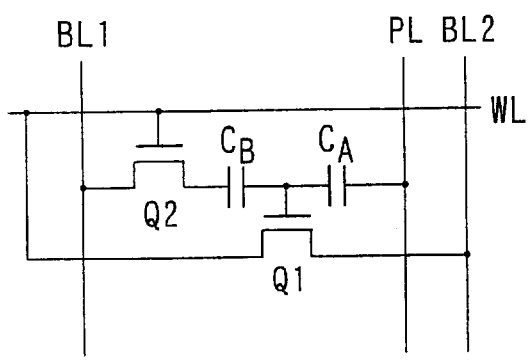
FIGS. 7A to 7D are circuit diagrams each showing a connection example when no common ground point exists.
Figure 7B:
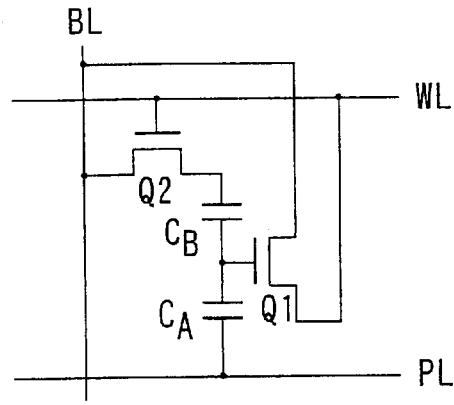
Figure 7C:
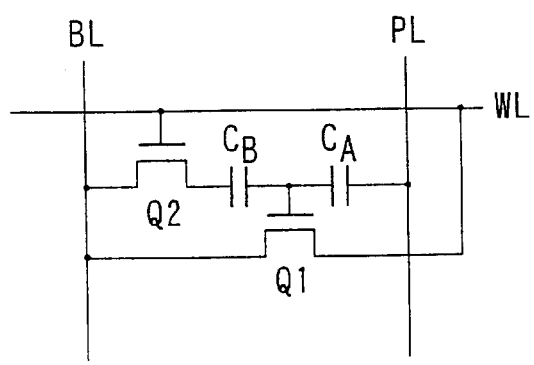
Figure 7D:
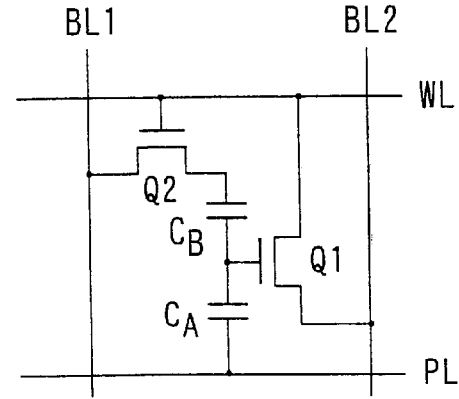
Figure 8A:
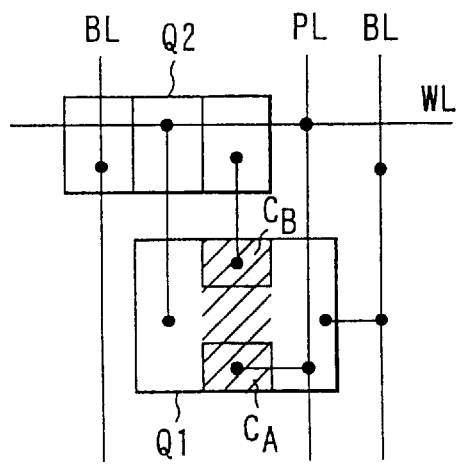
FIGS. 8A to 8D are plan views, respectively, showing cell arrangements for realizing the circuit arrangements of FIGS. 7A to 7D.
Figure 8B:
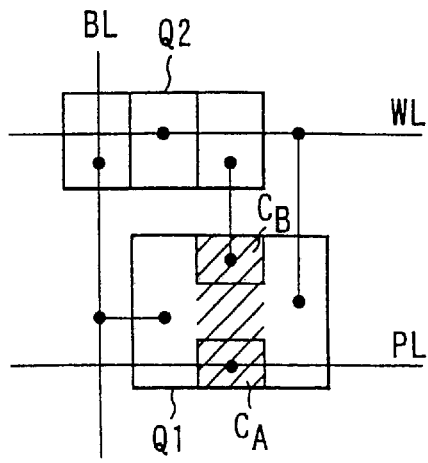
Figure 8C:
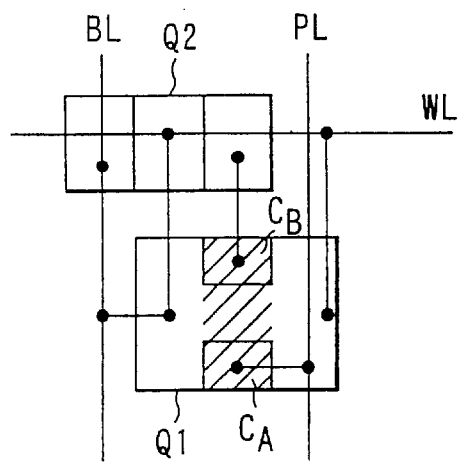
Figure 8D:
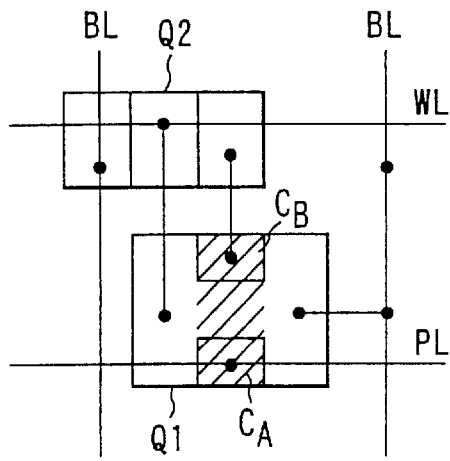
Figure 9A:
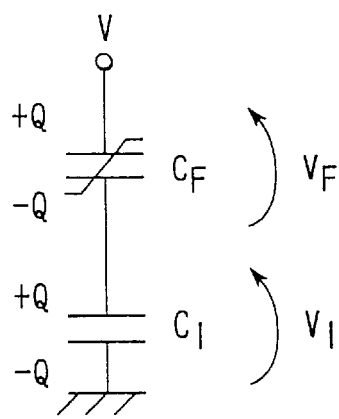
FIGS. 9A and 9B are a circuit diagram and a graph, respectively, for explaining the problem of a conventional ferroelectric non-volatile memory device.
Figure 9B:
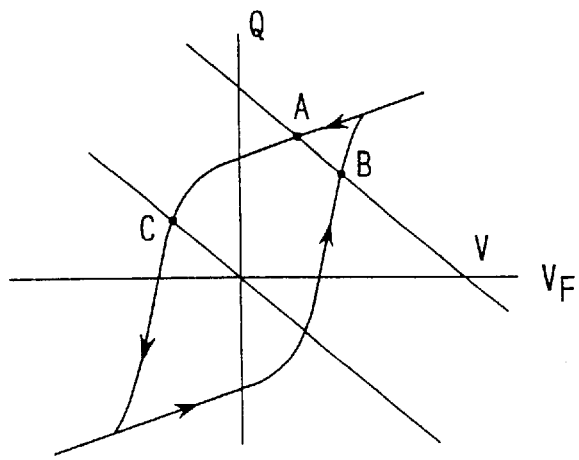

In FIG. 7A, unlike FIG. 5A, the source of the cell transistor Q1 is not grounded but is connected to a bit line BL2 of an adjacent cell parallel to a bit line BL1 connected to the selector transistor Q2. In FIG. 7B, unlike FIG. 5B, the source of the cell transistor Q1 is not grounded but is connected to the word line WL. In FIG. 7C, unlike FIG. 5C, the source of the cell transistor Q1 is not grounded but is connected to the word line WL. In FIG. 7D, unlike FIG. 5D, the source of the cell transistor Q1 is not grounded but is connected to the bit line BL2 of an adjacent cell parallel to the bit line BL1 connected to the selector transistor Q2.

Examples of the cell arrangement in this case are shown in FIGS. 8A to 8D. FIGS. 8A to 8D correspond to FIGS. 7A to 7D, respectively. As is apparent from FIGS. 8A to 8D, circuit arrangements as shown in FIGS. 7A to 7D can be laid out on the substrate without any change.

According to this embodiment, in addition to the cell structure as shown in FIG. 1, the selector transistor Q2 is connected to the terminal of the ferroelectric capacitor $C_B$ opposite to the cell transistor, i.e., between the ferroelectric capacitor $C_B$ and the bit line BL. As a result, the data retention time can be prolonged, and the data write-in voltage can be decreased. Moreover, an unselected cell can be prevented from being influenced by the write-in voltage. As a result, the reliability of the memory cell can be improved.

The present invention is not limited to the above-described embodiment. This embodiment uses PZT as the ferroelectric material of the ferroelectric capacitor, but the ferroelectric material is not limited to this. Any ferroelectric material can be used. Two ferroelectric capacitors connected to the gate electrode of a MOS transistor may have different ferroelectric film thicknesses, but their material and area must be the same.

The field effect transistor is not limited to a MOS transistor, and can be a MIS transistor using a gate insulator film instead of a gate oxide film. Further, the Si stripe is not limited to an npn stripe, and may be a pnp stripe for formation of a p-channel transistor.

As has been described above in detail, according to the present invention, a memory cell structure is formed by connecting two ferroelectric capacitors having almost the same remanent polarization to the gate electrode of a MOS or MIS field effect transistor. Data is stored by polarizing the ferroelectric thin films of the capacitors in opposite directions with respect to the gate electrode of the transistor. Since the voltage is directly applied to the ferroelectric thin film, the data write-in voltage can be decreased. At the same time, electric charges generated upon polarization of the ferroelectric thin film are not induced to the semiconductor surface of the channel region of the transistor. Since the internal electric fields of the two ferroelectric capacitors are 0 in a steady state after data is stored, the data retention time can be prolonged.

In addition, since the selector transistor is connected to one ferroelectric capacitor opposite to the cell transistor, an unselected cell can be prevented from being influenced by the write-in voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

While the preferred embodiment of the invention has been illustrated and described, it will be appreciated that various changes can be made therein without departing from the spirit and scope of the invention.

There will now be described a ferroelectric non-volatile memory device referring to FIGS. 1A and 1B.

In an equivalent circuit representing the memory cell structure of a ferroelectric non-volatile memory device shown in FIGS. 1A and 1B, one terminal of each of two ferroelectric capacitors $C_A$ and $C_B$ having the same remanent polarization is connected to the gate of a cell transistor (MOSFET) Tr having a MOS structure. The other terminal of the capacitor $C_A$ is connected to a terminal A, whereas the other terminal of the capacitor $C_B$ is connected to a terminal B. The transistor Tr and the capacitors $C_A$ and $C_B$ constitute one memory cell. The ferroelectric films of the capacitors $C_A$ and $C_B$ are made of PZT, and have the same area and film thickness.

The memory cell of this structure can also be used for an analog memory device. However, for descriptive convenience, the operation will be described by exemplifying a case in which the memory cell is used for a digital memory device. Although not shown, memory cells are arranged in a matrix to form a memory array.

To write data "0" or "1" in the memory cell of this structure, the terminal B is grounded, and a positive or negative voltage is applied to the terminal A. When the influence of the potential on the semiconductor side cannot be ignored owing to a large gate capacitance of the transistor Tr, ½ the voltage applied to the terminal A is applied to set the potential of the semiconductor to a floating state or an intermediate potential between two series-connected ferroelectric capacitors.

In this description, "1" is a state in which a positive voltage is applied to the terminal A to make the polarization direction of the ferroelectric capacitor $C_A$ downward and the polarization direction of the ferroelectric capacitor $C_B$ upward, as shown in FIG. 1A. "0" is a state in which a negative voltage is applied to the terminal A to make the polarization direction of the ferroelectric capacitor $C_A$ upward and the polarization direction of the ferroelectric capacitor $C_B$ downward, as shown in FIG. 1B.

When the voltage of the terminal A is reset to 0 after "0" or "1" is written, no electric charges are induced to the gate electrode of the transistor Tr and the semiconductor surface of the channel region because the two ferroelectric capacitors $C_A$ and $C_B$ have the same remanent polarization. Accordingly, $V_G$ is kept to 0V from the relation Of $Q_G=C_G V_G$ ($Q_G$: the electric charges of the gate electrode, $C_G$: gate capacitance, $V_G$: gate potential). Hence, the internal electric fields of the two ferroelectric capacitors $C_A$ and $C_B$ are 0 regardless of whether data is held in a "0" or "1" state. The data retention time is expected to be as long as that of a general one-transistor/one-capacitor ferroelectric memory cell having a structure similar to the DRAM. Since the voltage is directly applied to the ferroelectric capacitor, the write-in voltage is expected to be low even with a high relative dielectric constant of the ferroelectric thin film.

To read data written in the memory cell, the terminal A is opened, the semiconductor substrate is grounded, and a positive voltage is applied to the terminal B. In this case, when written data is "1", as shown in FIG. 1A, the polarization amount of the ferroelectric capacitor $C_B$ greatly changes, and the electric charges $Q_G$ of the gate electrode change from 0. Letting P be the polarization amount of the ferroelectric thin film upon application of a positive voltage, $Q_G=(P_r+P)S$ (S: the area of the ferroelectric capacitor, $P_r$: the remanent polarization of the ferroelectric film). $P=-P_r$ holds before application of a positive voltage, and changes to $P=P_S$ ($P_S$: saturated polarization) after application of a sufficiently large positive voltage. Then, electric charges $-Q_G$ are generated near the semiconductor surface. By properly selecting the threshold voltage of the transistor Tr, the source-drain path flows a current by inversion electrons.

When written data is "0", no polarization reversal of the ferroelectric thin film occurs. Even for a sufficiently large positive application voltage, only $(P_S-P_r)S$ electric charges $Q_G$ are generated in the gate electrode. Since the difference between $P_S$ and $P_r$ is generally small, almost no negative electric charges are induced to the semiconductor surface. In this case, the source-drain path of the transistor Tr does not flow any current.

Thus, data can be read by applying a pulse voltage to the terminal B and measuring the drain current of the MOSFET at this time. In read, the voltage is applied through the gate insulator film of the MOSFET, and the read-out voltage may rise. However, this read-out voltage need not be applied until $P=P_S$ holds for written data "1". Even a voltage enough to set P=0 is applied to establish $Q_G=P_r S$, and satisfactory read operation can be achieved.

After read, both the terminals A and B are reset to 0V. For written data "0", $Q_G=0$ holds, and the state returns to one before read. For written data "1", the polarization does not perfectly return to the original one when the read-out voltage is reset to 0. For this reason, data "1" is rewritten based on read-out data at a proper frequency.

In this structure, the terminal B is grounded, a positive or negative voltage is applied to the terminal A, and the ferroelectric thin films of the ferroelectric capacitors $C_A$ and $C_B$ are polarized in opposite directions with respect to the gate electrode. Data can be stored in accordance with the polarization direction and remanent polarization of the ferroelectric thin film without inducing electric charges generated upon polarization of the ferroelectric thin film to the channel region. Since the internal electric fields of the two ferroelectric capacitors $C_A$ and $C_B$ are 0 regardless of whether data is held in a "0" or "1" state, the data retention time can be prolonged. Since the voltage is directly applied to the ferroelectric thin film, the data write-in voltage can be decreased.

The results of analyzing the characteristics of a transistor with this structure using a circuit simulator SPICE will be described. FIG. 2A shows a circuit used for operation analysis, and FIG. 2B shows a change in drain current upon application of a read-out pulse.

While switches SW0, SW1, and SW2 are OFF, ON, and OFF, respectively, a positive or negative voltage is applied to a terminal n2 to store data "0" or "1". The switches SW0, SW1, and SW2 are respectively turned off, on, and on, thereby holding the memory state. The switches SW0, SW1, and SW2 are respectively turned on, off, and off, and a voltage is applied to a terminal n0 to read out data. From FIGS. 2A and 2B, data "0" or "1" can be easily read out by measuring the drain current.

An embodiment of the present invention will be described in detail with reference to the several views of the accompanying drawing.

This embodiment adds, to the structure of FIGS. 1A and 1B, a selector transistor comprised of a MOSFET so as not to influence an unselected cell by the write-in voltage.

The MOSFET serving as a switch for selective write operation is connected to the portion (FIG. 3A) of the terminal A (or terminal B) in FIGS. 1A and 1B, or at a portion (FIG. 3B) between the gate and one capacitor. In other words, in the structure shown in FIG. 3A, the gate of a cell transistor Q1 is connected to the node of the capacitors $C_A$ and $C_B$ connected in series to each other. A selector transistor Q2 is connected between a capacitor $C_B$ and a terminal b. The terminals a, b and c are connected to a driver DR. In the structure shown in FIG. 3B, a selector transistor Q2 is between the gate of the cell transistor $Q_1$ and the capacitor $C_B$.

Regardless of whether the selector transistor is connected to either of the two positions shown in FIGS. 3A and 3B, the same effects can be obtained as far as the selector transistor is kept off when the cell is not selected. In terms of the manufacture, the structure of FIG. 3A is superior because two capacitors can be directly formed on the floating gate electrode of the cell transistor. This embodiment will examine an arrangement in which the structure of FIG. 3A is processed as a unit cell.

According to the structure shown in FIG. 3A, in write, a voltage applied to the terminal c turns on/off the selector transistor Q2 to control whether a voltage appearing between the terminals a and b is actually applied to the ferroelectric capacitors $C_A$ and $C_B$. Accordingly, voltages at the terminals a, b, and c must be independently controlled from a peripheral circuit. Constituting this memory cell array requires at least three control lines a', b', and c'. If the lines b' and c' are parallel to each other, cells connected to them similarly operate, and do not play the role as a selector switch. Hence, the lines b' and c' must cross each other, and the three lines are arranged as shown in FIG. 4A or 4B. According to convention, the lines a', b', and c' will be referred to as a plate line (PL), bit line (BL), and word line (WL).

In FIG. 4A, one terminal of the capacitor $C_A$ is connected to the gate electrode of the cell transistor Q1, and the other terminal is connected to the plate line PL. One terminal of the capacitor $C_B$ is connected to the gate electrode of the cell transistor Q1, and the other terminal is connected to the bit line BL via the selector transistor Q2. The gate electrode of the selector transistor Q2 is connected to the word line WL. In FIG. 4B, the connection is the same except that the plate line PL is parallel to the word line WL.

Read operation will be explained. In read, the terminal of one capacitor is opened, the polarization of the other capacitor is reversed, and a current flowing through the d–e path at this time is detected. A new current detection line may be arranged, which is not preferable for a high cell arrangement density. Thus, the terminal d is connected to one of the word line WL, bit line BL, and plate line PL, and the terminal e is grounded. A case in which no common ground point exists, like an SOI (Si film on an insulator) substrate, will also be considered at last.

When the polarization is reversed via the plate line PL without the mediacy of the selector transistor Q2 for cell selection, the line connected to the terminal d must cross the plate line PL. On the other hand, when the polarization is reversed via the bit line BL, the plate line PL must be open, and thus the terminal d cannot be connected to the plate line PL. Therefore, available connection methods are limited to four methods shown in FIGS. 5A to 5D.

In FIG. 5A, in addition to the structure of FIG. 4A, the source of the cell transistor Q1 is grounded, and its drain is connected to the word line WL. In FIG. 5B, in addition to the structure of FIG. 4B, the source of the cell transistor Q1 is grounded, and its drain is connected to the bit line BL. In FIG. 5C, in addition to the structure of FIG. 4A, the source of the cell transistor Q1 is grounded, and its drain is connected to the bit line BL. In FIG. 5D, in addition to the structure of FIG. 4B, the source of the cell transistor Q1 is grounded, and its drain is connected to the word line WL.

A structure in which the source of the cell transistor Q1 is grounded, and its drain is connected to the word line WL, like the connection of FIG. 5D, is shown in the sectional view of a device structure in FIG. 6. An n-channel MOS transistor (cell transistor) Q1 made up of n-type diffusion regions 62 and a gate electrode 63, and an n-channel MOS transistor (selector transistor) Q2 made up of n-type diffusion regions 64 and a gate electrode 65 are formed on a p-type Si substrate 61 so as to be adjacent to each other. Capacitor electrodes 67 and 68 are formed on the gate electrode 63 of the cell transistor Q1 via a ferroelectric film 66 and formed of ferroelectric thin films, thereby constituting the two ferroelectric capacitors $C_A$ and $C_B$.

If no common ground point exists, like an SOI substrate, a line grounded in read can be used. Connection methods in this case are shown in FIGS. 7A to 7D. In FIGS. 7A to 7D, some of the methods use the line of an adjacent cell in consideration of an actual arrangement.

In FIG. 7A, unlike FIG. 5A, the source of the cell transistor Q1 is not grounded but is connected to a bit line BL2 of an adjacent cell parallel to a bit line BL1 connected to the selector transistor Q2. In FIG. 7B, unlike FIG. 5B, the source of the cell transistor Q1 is not grounded but is connected to the word line WL. In FIG. 7C, unlike FIG. 5C, the source of the cell transistor Q1 is not grounded but is connected to the word line WL. In FIG. 7D, unlike FIG. 5D, the source of the cell transistor Q1 is not grounded but is connected to the bit line BL2 of an adjacent cell parallel to the bit line BL1 connected to the selector transistor Q2.

Examples of the cell arrangement in this case are shown in FIGS. 8A to 8D. FIGS. 8A to 8D correspond to FIGS. 7A to 7D, respectively. As is apparent from FIGS. 8A to 8D, circuit arrangements as shown in FIGS. 7A to 7D can be laid out on the substrate without any change.

According to this embodiment, in addition to the cell structure as shown in FIG. 1, the selector transistor Q2 is connected to the terminal of the ferroelectric capacitor $C_B$ opposite to the cell transistor, i.e., between the ferroelectric capacitor $C_B$ and the bit line BL. As a result, the data retention time can be prolonged, and the data write-in voltage can be decreased. Moreover, an unselected cell can be prevented from being influenced by the write-in voltage. As a result, the reliability of the memory cell can be improved.

The present invention is not limited to the above-described embodiment. This embodiment uses PZT as the ferroelectric material of the ferroelectric capacitor, but the ferroelectric material is not limited to this. Any ferroelectric material can be used. Two ferroelectric capacitors connected to the gate electrode of a MOS transistor may have different ferroelectric film thicknesses, but their material and area must be the same.

The field effect transistor is not limited to a MOS transistor, and can be a MIS transistor using a gate insulator film instead of a gate oxide film. Further, the Si stripe is not limited to an npn stripe, and may be a pnp stripe for formation of a p-channel transistor.

As has been described above in detail, according to the present invention, a memory cell structure is formed by connecting two ferroelectric capacitors having almost the same remanent polarization to the gate electrode of a MOS or MIS field effect transistor. Data is stored by polarizing the ferroelectric thin films of the capacitors in opposite directions with respect to the gate electrode of the transistor. Since the voltage is directly applied to the ferroelectric thin film, the data write-in voltage can be decreased. At the same time, electric charges generated upon polarization of the ferroelectric thin film are not induced to the semiconductor surface of the channel region of the transistor. Since the internal electric fields of the two ferroelectric capacitors are 0 in a steady state after data is stored, the data retention time can be prolonged.

In addition, since the selector transistor is connected to one ferroelectric capacitor opposite to the cell transistor, an unselected cell can be prevented from being influenced by the write-in voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

There will now be described a ferroelectric non-volatile memory device referring to FIGS. 1A and 1B.

In an equivalent circuit representing the memory cell structure of a ferroelectric non-volatile memory device shown in FIGS. 1A and 1B, one terminal of each of two ferroelectric capacitors $C_A$ and $C_B$ having the same remanent polarization is connected to the gate of a cell transistor (MOSFET) Tr having a MOS structure. The other terminal of the capacitor $C_A$ is connected to a terminal A, whereas the other terminal of the capacitor $C_B$ is connected to a terminal B. The transistor Tr and the capacitors $C_A$ and $C_B$ constitute one memory cell. The ferroelectric films of the capacitors $C_A$ and $C_B$ are made of PZT, and have the same area and film thickness.

The memory cell of this structure can also be used for an analog memory device. However, for descriptive convenience, the operation will be described by exemplifying a case in which the memory cell is used for a digital memory device. Although not shown, memory cells are arranged in a matrix to form a memory array.

To write data "0" or "1" in the memory cell of this structure, the terminal B is grounded, and a positive or negative voltage is applied to the terminal A. When the influence of the potential on the semiconductor side cannot be ignored owing to a large gate capacitance of the transistor Tr, ½ the voltage applied to the terminal A is applied to set the potential of the semiconductor to a floating state or an intermediate potential between two series-connected ferroelectric capacitors.

In this description, "1" is a state in which a positive voltage is applied to the terminal A to make the polarization direction of the ferroelectric capacitor $C_A$ downward and the polarization direction of the ferroelectric capacitor $C_B$ upward, as shown in FIG. 1A. "0" is a state in which a negative voltage is applied to the terminal A to make the polarization direction of the ferroelectric capacitor $C_A$ upward and the polarization direction of the ferroelectric capacitor $C_B$ downward, as shown in FIG. 1B.

When the voltage of the terminal A is reset to 0 after "0" or "1" is written, no electric charges are induced to the gate electrode of the transistor Tr and the semiconductor surface of the channel region because the two ferroelectric capacitors $C_A$ and $C_B$ have the same remanent polarization. Accordingly, $V_G$ is kept to 0V from the relation of $Q_G=C_GV_G$ ($Q_G$: the electric charges of the gate electrode, $C_G$: gate capacitance, $V_G$: gate potential). Hence, the internal electric fields of the two ferroelectric capacitors $C_A$ and $C_B$ are 0 regardless of whether data is held in a "0" or "1" state. The data retention time is expected to be as long as that of a general one-transistor/one-capacitor ferroelectric memory cell having a structure similar to the DRAM. Since the voltage is directly applied to the ferroelectric capacitor, the write-in voltage is expected to be low even with a high relative dielectric constant of the ferroelectric thin film.

To read data written in the memory cell, the terminal A is opened, the semiconductor substrate is grounded, and a positive voltage is applied to the terminal B. In this case, when written data is "1", as shown in FIG. 1A, the polarization amount of the ferroelectric capacitor $C_B$ greatly changes, and the electric charges $Q_G$ of the gate electrode change from 0. Letting P be the polarization amount of the ferroelectric thin film upon application of a positive voltage, $Q_G=(P_r+P)S$ (S: the area of the ferroelectric capacitor, $P_r$: the remanent polarization of the ferroelectric film). $P=-P_r$ holds before application of a positive voltage, and changes to $P=P_S$ ($P_S$: saturated polarization) after application of a sufficiently large positive voltage. Then, electric charges $-Q_G$ are generated near the semiconductor surface. By properly selecting the threshold voltage of the transistor Tr, the source-drain path flows a current by inversion electrons.

When written data is "0", no polarization reversal of the ferroelectric thin film occurs. Even for a sufficiently large positive application voltage, only $(P_S-P_r)S$ electric charges $Q_G$ are generated in the gate electrode. Since the difference between $P_S$ and $P_r$ is generally small, almost no negative electric charges are induced to the semiconductor surface. In this case, the source-drain path of the transistor Tr does not flow any current.

Thus, data can be read by applying a pulse voltage to the terminal B and measuring the drain current of the MOSFET at this time. In read, the voltage is applied through the gate insulator film of the MOSFET, and the read-out voltage may rise. However, this read-out voltage need not be applied until $P=P_S$ holds for written data "1". Even a voltage enough to set $P=0$ is applied to establish $Q_G=P_rS$, and satisfactory read operation can be achieved.

After read, both the terminals A and B are reset to 0V. For written data "0", $Q_G=0$ holds, and the state returns to one before read. For written data "1", the polarization does not perfectly return to the original one when the read-out voltage is reset to 0. For this reason, data "1" is rewritten based on read-out data at a proper frequency.

In this structure, the terminal B is grounded, a positive or negative voltage is applied to the terminal A, and the ferroelectric thin films of the ferroelectric capacitors $C_A$ and $C_B$ are polarized in opposite directions with respect to the gate electrode. Data can be stored in accordance with the polarization direction and remanent polarization of the ferroelectric thin film without inducing electric charges generated upon polarization of the ferroelectric thin film to the channel region. Since the internal electric fields of the two ferroelectric capacitors $C_A$ and $C_B$ are 0 regardless of whether data is held in a "0" or "1" state, the data retention time can be prolonged. Since the voltage is directly applied to the ferroelectric thin film, the data write-in voltage can be decreased.

The results of analyzing the characteristics of a transistor with this structure using a circuit simulator SPICE will be described. FIG. 2A shows a circuit used for operation analysis, and FIG. 2B shows a change in drain current upon application of a read-out pulse.

While switches SW0, SW1, and SW2 are OFF, ON, and OFF, respectively, a positive or negative voltage is applied to a terminal n2 to store data "0" or "1". The switches SW0, SW1, and SW2 are respectively turned off, on, and on, thereby holding the memory state. The switches SW0, SW1, and SW2 are respectively turned on, off, and off, and a voltage is applied to a terminal n0 to read out data. From FIGS. 2A and 2B, data "0" or "1" can be easily read out by measuring the drain current.

An embodiment of the present invention will be described in detail with reference to the several views of the accompanying drawing.

This embodiment adds, to the structure of FIGS. 1A and 1B, a selector transistor comprised of a MOSFET so as not to influence an unselected cell by the write-in voltage.

The MOSFET serving as a switch for selective write operation is connected to the portion (FIG. 3A) of the terminal A (or terminal B) in FIGS. 1A and 1B, or at a portion (FIG. 3B) between the gate and one capacitor. In other words, in the structure shown in FIG. 3A, the gate of a cell transistor Q1 is connected to the node of the capacitors $C_A$ and $C_B$ connected in series to each other. A selector transistor Q2 is connected between a capacitor $C_B$ and a terminal b. The terminals a, b and c are connected to a driver DR. In the structure shown in FIG. 3B, a selector transistor Q2 is between the gate of the cell transistor $Q_1$ and the capacitor $C_B$.

Regardless of whether the selector transistor is connected to either of the two positions shown in FIGS. 3A and 3B, the same effects can be obtained as far as the selector transistor is kept off when the cell is not selected. In terms of the manufacture, the structure of FIG. 3A is superior because two capacitors can be directly formed on the floating gate electrode of the cell transistor. This embodiment will examine an arrangement in which the structure of FIG. 3A is processed as a unit cell.

According to the structure shown in FIG. 3A, in write, a voltage applied to the terminal c turns on/off the selector transistor Q2 to control whether a voltage appearing between the terminals a and b is actually applied to the ferroelectric capacitors $C_A$ and $C_B$. Accordingly, voltages at the terminals a, b, and c must be independently controlled from a peripheral circuit. Constituting this memory cell array requires at least three control lines a', b', and c'. If the lines b' and c' are parallel to each other, cells connected to them similarly operate, and do not play the role as a selector switch. Hence, the lines b' and c' must cross each other, and the three lines are arranged as shown in FIG. 4A or 4B. According to convention, the lines a', b', and c' will be referred to as a plate line (PL), bit line (BL), and word line (WL).

In FIG. 4A, one terminal of the capacitor $C_A$ is connected to the gate electrode of the cell transistor Q1, and the other terminal is connected to the plate line PL. One terminal of the capacitor $C_B$ is connected to the gate electrode of the cell transistor Q1, and the other terminal is connected to the bit line BL via the selector transistor Q2. The gate electrode of the selector transistor Q2 is connected to the word line WL. In FIG. 4B, the connection is the same except that the plate line PL is parallel to the word line WL.

Read operation will be explained. In read, the terminal of one capacitor is opened, the polarization of the other capacitor is reversed, and a current flowing through the d–e path at this time is detected. A new current detection line may be arranged, which is not preferable for a high cell arrangement density. Thus, the terminal d is connected to one of the word line WL, bit line BL, and plate line PL, and the terminal e is grounded. A case in which no common ground point exists, like an SOI (Si film on an insulator) substrate, will also be considered at last.

When the polarization is reversed via the plate line PL without the mediacy of the selector transistor Q2 for cell selection, the line connected to the terminal d must cross the plate line PL. On the other hand, when the polarization is reversed via the bit line BL, the plate line PL must be open, and thus the terminal d cannot be connected to the plate line PL. Therefore, available connection methods are limited to four methods shown in FIGS. 5A to 5D.

In FIG. 5A, in addition to the structure of FIG. 4A, the source of the cell transistor Q1 is grounded, and its drain is connected to the word line WL. In FIG. 5B, in addition to the structure of FIG. 4B, the source of the cell transistor Q1 is grounded, and its drain is connected to the bit line BL. In FIG. 5C, in addition to the structure of FIG. 4A, the source of the cell transistor Q1 is grounded, and its drain is connected to the bit line BL. In FIG. 5D, in addition to the structure of FIG. 4B, the source of the cell transistor Q1 is grounded, and its drain is connected to the word line WL.

A structure in which the source of the cell transistor Q1 is grounded, and its drain is connected to the word line WL, like the connection of FIG. 5D, is shown in the sectional view of a device structure in FIG. 6. An n-channel MOS transistor (cell transistor) Q1 made up of n-type diffusion regions 62 and a gate electrode 63, and an n-channel MOS transistor (selector transistor) Q2 made up of n-type diffusion regions 64 and a gate electrode 65 are formed on a p-type Si substrate 61 so as to be adjacent to each other. Capacitor electrodes 67 and 68 are formed on the gate electrode 63 of the cell transistor Q1 via a ferroelectric film 66 and formed of ferroelectric thin films, thereby constituting the two ferroelectric capacitors $C_A$ and $C_B$.

If no common ground point exists, like an SOI substrate, a line grounded in read can be used. Connection methods in this case are shown in FIGS. 7A to 7D. In FIGS. 7A to 7D, some of the methods use the line of an adjacent cell in consideration of an actual arrangement.

In FIG. 7A, unlike FIG. 5A, the source of the cell transistor Q1 is not grounded but is connected to a bit line BL2 of an adjacent cell parallel to a bit line BL1 connected to the selector transistor Q2. In FIG. 7B, unlike FIG. 5B, the source of the cell transistor Q1 is not grounded but is connected to the word line WL. In FIG. 7C, unlike FIG. 5C, the source of the cell transistor Q1 is not grounded but is connected to the word line WL. In FIG. 7D, unlike FIG. 5D, the source of the cell transistor Q1 is not grounded but is connected to the bit line BL2 of an adjacent cell parallel to the bit line BL1 connected to the selector transistor Q2.

Examples of the cell arrangement in this case are shown in FIGS. 8A to 8D. FIGS. 8A to 8D correspond to FIGS. 7A to 7D, respectively. As is apparent from FIGS. 8A to 8D, circuit arrangements as shown in FIGS. 7A to 7D can be laid out on the substrate without any change.

According to this embodiment, in addition to the cell structure as shown in FIG. 1, the selector transistor Q2 is connected to the terminal of the ferroelectric capacitor $C_B$ opposite to the cell transistor, i.e., between the ferroelectric capacitor $C_B$ and the bit line BL. As a result, the data retention time can be prolonged, and the data write-in voltage can be decreased. Moreover, an unselected cell can be prevented from being influenced by the write-in voltage. As a result, the reliability of the memory cell can be improved.

The present invention is not limited to the above-described embodiment. This embodiment uses PZT as the ferroelectric material of the ferroelectric capacitor, but the ferroelectric material is not limited to this. Any ferroelectric material can be used. Two ferroelectric capacitors connected to the gate electrode of a MOS transistor may have different ferroelectric film thicknesses, but their material and area must be the same.

The field effect transistor is not limited to a MOS transistor, and can be a MIS transistor using a gate insulator film instead of a gate oxide film. Further, the Si stripe is not limited to an npn stripe, and may be a pnp stripe for formation of a p-channel transistor.

As has been described above in detail, according to the present invention, a memory cell structure is formed by connecting two ferroelectric capacitors having almost the same remanent polarization to the gate electrode of a MOS or MIS field effect transistor. Data is stored by polarizing the ferroelectric thin films of the capacitors in opposite directions with respect to the gate electrode of the transistor. Since the voltage is directly applied to the ferroelectric thin film, the data write-in voltage can be decreased. At the same time, electric charges generated upon polarization of the ferroelectric thin film are not induced to the semiconductor surface of the channel region of the transistor. Since the internal electric fields of the two ferroelectric capacitors are 0 in a steady state after data is stored, the data retention time can be prolonged.

In addition, since the selector transistor is connected to one ferroelectric capacitor opposite to the cell transistor, an unselected cell can be prevented from being influenced by the write-in voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The embodiments of the invention in which an exclusive property or privilege claimed are defined as follows:

1. A ferroelectric non-volatile memory device comprising:
   a cell transistor constituted by an n-channel MOS transistor having a p-type silicon substrate, a pair of first n-type diffusion regions formed in the p-type silicon substrate, and a gate electrode placed, with an insulating intermediate layer, over the p-type silicon substrate between the first n-type diffusion regions;
   a selector transistor which is adjacent to said cell transistor, and is constituted by an n-channel MOS transistor having a pair of second n-type diffusion regions formed in the p-type substrate, and a second gate electrode placed, with an insulating intermediate layer, over the p-type silicon substrate between the second n-type diffusion regions; and
   two capacitors formed of a ferroelectric film formed on the gate electrode of said cell transistor, and two capacitor electrodes formed on said ferroelectric film and formed of ferroelectric thin films, wherein one of said capacitors is connected to one of the second n-type diffusion regions of said selector transistor and the capacitor electrodes are electrically separated from the first n-type diffusion regions of the cell transistor.

2. The memory device according to claim 1, which further comprises a plate line connected to the capacitor electrode of the other of said capacitors, a word line connected to the second gate electrode of said selector transistor, and a bit line connected to the other of said second n-type diffusion regions of said selector transistor, and the first n-type diffusion regions of said cell transistor are respectively grounded and connected to said word line.

3. The memory device according to claim 1, further comprising a driver configured to polarize the ferroelectric thin films of said capacitors in opposite directions with respect to the gate electrode of said cell transistor to store data.

4. The memory device according to claim 3, wherein said driver comprises a driver unit configured to, in data write, apply a voltage to the gate electrode of said selector transistor to cause polarization corresponding to the data in said capacitors via said selector transistor in order to turn on said selector transistor, and in data read, apply a voltage pulse to one terminal of each capacitor via said selector transistor in order to read out data corresponding to a polarization direction of said capacitor.

5. The memory device according to claim 1, which further comprises a plate line connected to the capacitor electrode of the other of the capacitors, a word line connected to the second gate electrode of the selector transistor, and a bit line connected to the other of the second n-type diffusion regions of the selector transistor, and the first n-type diffusion regions of the cell transistor are respectively grounded and connected to the bit line.

6. The memory device according to claim 1, which further comprises a plate line connected to the capacitor electrode of the other of the capacitors, a word line connected to the second gate electrode of the selector transistor, and a first bit line connected to the other of the second n-type diffusion regions of the selector transistor, and a second bit line connected to one of the first n-type diffusion regions of the cell transistor, the other of the first n-type diffusion regions being connected to the word line.

7. A ferroelectric non-volatile memory device comprising:
   a cell transistor constituted by an n-channel MOS transistor having a p-type silicon substrate, a pair of first n-type diffusion regions formed in the p-type silicon substrate, and a gate electrode placed, with an insulating intermediate layer, over the p-type silicon substrate between the first n-type diffusion regions;
   a selector transistor which is adjacent to the cell transistor, and is constituted by an n-channel MOS transistor having a pair of second n-type diffusion regions formed in the p-type substrate, and a second gate electrode placed, with an insulating intermediate layer, over the p-type silicon substrate between the second n-type diffusion regions;
   two capacitors formed of a ferroelectric film formed on the gate electrode of the cell transistor, and two capacitor electrodes formed on the ferroelectric film and formed of ferroelectric thin films, wherein one of the capacitors is connected to one of the second n-type diffusion regions of the selector transistor;
   a plate line connected to the capacitor electrode of the other of the capacitors;
   a word line connected to the second gate electrode of the selector transistor; and a bit line connected to the other of the second n-type diffusion regions of the selector transistor;

wherein the first n-type diffusion regions of the cell transistor are respectively grounded and connected to the word line.

8. The memory device according to claim 7, further comprising a driver configured to polarize the ferroelectric thin films of the capacitors in opposite directions with respect to the gate electrode of the cell transistor to store data.

9. The memory device according to claim 8, wherein the driver comprises a driver unit configured to, in data write, apply a voltage to the gate electrode of the selector transistor to cause polarization corresponding to the data in the capacitors via the selector transistor in order to turn on the selector transistor, and in data read, apply a voltage pulse to one terminal of each capacitor via the selector transistor in order to read out data corresponding to a polarization direction of the capacitor.

* * * * *